US012701687B2

(12) United States Patent　　　　(10) Patent No.:　US 12,701,687 B2
　　Lin　　　　　　　　　　　　　　　(45) Date of Patent:　　　Aug. 4, 2026

(54) SUBSTRATE PICKUP TOOL, SUBSTRATE ASSEMBLY STATION AND SUBSTRATE INSTALLATION METHOD

(71) Applicant: WISTRON CORP., New Taipei City (TW)

(72) Inventor: chieh-hsiang Lin, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 265 days.

(21) Appl. No.: 18/512,236

(22) Filed: Nov. 17, 2023

(65) Prior Publication Data

US 2025/0098130 A1　　Mar. 20, 2025

(30) Foreign Application Priority Data

Sep. 19, 2023　(TW) ................................. 112135715

(51) Int. Cl.
*H05K 13/00*　　　(2006.01)
*B25J 15/00*　　　(2006.01)
*B65G 47/90*　　　(2006.01)

(52) U.S. Cl.
CPC ...... *H05K 13/0069* (2013.01); *B25J 15/0047* (2013.01); *B65G 47/90* (2013.01)

(58) Field of Classification Search
CPC .............. B25J 15/0071; B25J 15/0047; H01K 13/0069; B65G 47/90
See application file for complete search history.

(56) References Cited

U.S. PATENT DOCUMENTS

| | | | | |
|---|---|---|---|---|
| 2,876,033 | A | * | 3/1959 | Britt .......................... B66C 1/54 |
| | | | | 294/198 |
| 8,511,730 | B2 | * | 8/2013 | Goudy ................. B25J 15/0047 |
| | | | | 294/93 |
| 12,545,510 | B2 | * | 2/2026 | Whelan ................ B25J 15/0047 |
| 2003/0002400 | A1 | * | 1/2003 | Klein ...................... G11B 23/40 |
| | | | | 369/30.55 |
| 2007/0222245 | A1 | * | 9/2007 | Maffeis .................... B25J 15/12 |
| | | | | 294/93 |
| 2015/0336277 | A1 | * | 11/2015 | Schanz .................. C10G 7/006 |
| | | | | 294/97 |
| 2017/0050323 | A1 | * | 2/2017 | Shi ........................ B25J 15/0047 |

(Continued)

FOREIGN PATENT DOCUMENTS

| | | | | | | |
|---|---|---|---|---|---|---|
| JP | 2010042461 | A | * | 2/2010 | | |
| JP | 2018061987 | A | * | 4/2018 | ............. | B22C 23/00 |
| JP | 2002210689 | A | * | 7/2022 | | |

*Primary Examiner* — Gerald McClain
(74) *Attorney, Agent, or Firm* — McClure, Qualey & Rodack, LLP

(57) ABSTRACT

A substrate pickup tool is used to pick up a substrate provided with a through hole. The substrate pickup tool includes a gripper frame and a flexible gripper. The flexible gripper includes an annular mount portion and a plurality of claw portions. The annular mount portion is mounted on the gripper frame, the claw portions are connected to the annular mount portion and each has an outer contact surface. The flexible gripper is used to correspond to the through hole of the substrate, and the claw portions are driven to move relative to the annular mount portion for pressing against an inner wall surface of the through hole via the outer contact surface of each of the claw portions.

17 Claims, 12 Drawing Sheets

(56)            References Cited

U.S. PATENT DOCUMENTS

2020/0276714 A1\*   9/2020   Declerck ................ B25J 9/1612
2025/0091228 A1\*   3/2025   Ehrismann ........... B25J 15/0047
2025/0187204 A1\*   6/2025   Venture ................ B25J 15/0061

\* cited by examiner

SUBSTRATE PICKUP TOOL, SUBSTRATE ASSEMBLY STATION AND SUBSTRATE INSTALLATION METHOD

CROSS-REFERENCE TO RELATED APPLICATIONS

This non-provisional application claims priority under 35 U.S.C. § 119 (a) on Patent Application No(s). 112135715 filed in Taiwan, R.O.C. on Sep. 19, 2023, the entire contents of which are hereby incorporated by reference.

TECHNICAL FIELD

The disclosure relates to a pickup tool, assembly station and installation method, more particularly to a substrate pickup tool, a substrate assembly station and a substrate installation method.

BACKGROUND

As technology progress, manufacturing processes of various parts of electronic devices are complicated. For example, semiconductor wafers, printed circuit boards, or display panels need to go through multiple processes such as grinding, machining, etching, and high-temperature heating. After each process, they even need to be assembled with external components.

Taking the assembly of a semiconductor wafer to an external component as an example, a vacuum suction is used to hold and move the semiconductor wafer. However, since multiple electronic components can be disposed on the semiconductor wafer, the surface of the semiconductor wafer is no longer flat and even, so the previous vacuum suction method can no longer hold and move the semiconductor wafer provided with electronic components. Therefore, how to effectively hold and move the semiconductor wafer provided with electronic components is one of issues to be solved.

SUMMARY

The disclosure provides a substrate pickup tool, a substrate assembly station and a substrate installation method which are capable of stacking a substrate provided with electronic components onto an assembling part.

One embodiment of the disclosure provides a substrate pickup tool. The substrate pickup tool is used to pick up a substrate provided with a through hole. The substrate pickup tool includes a gripper frame and a flexible gripper. The flexible gripper includes an annular mount portion and a plurality of claw portions. The annular mount portion is mounted on the gripper frame, the claw portions are connected to the annular mount portion and each has an outer contact surface. The flexible gripper is used to correspond to the through hole of the substrate, and the claw portions are driven to move relative to the annular mount portion for pressing against an inner wall surface of the through hole via the outer contact surface of each of the claw portions.

Another embodiment of the disclosure provides a substrate assembly station. The substrate assembly station is used to install a substrate having a through hole onto an assembling part. The substrate assembly station includes a support device, a transfer mechanism and a substrate pickup tool. The support device includes a support surface and a carrier. The support surface and the carrier are used to support the substrate and the assembling part, respectively.

The transfer mechanism is disposed on the support device and provided with a movable portion movable relative to the support device. The substrate pickup tool includes a gripper frame and a flexible gripper. The gripper frame is disposed on the movable portion of the transfer mechanism. The flexible gripper includes an annular mount portion and a plurality of claw portions. The annular mount portion is mounted on the gripper frame, the claw portions are connected to the annular mount portion and each has an outer contact surface. The flexible gripper is used to correspond to the through hole of the substrate, and the claw portions are driven to move relative to the annular mount portion and press against an inner wall surface of the through hole via the outer contact surface of each of the claw portions for picking up the substrate and moving the substrate onto the assembling part via the transfer mechanism.

Still another embodiment of the disclosure provides a substrate installation method. The substrate installation method includes holding a substrate via at least one outer contact surface of a flexible gripper of a substrate pickup tool, lifting up the substrate pickup tool and moving the substrate pickup tool to stack the substrate onto an assembling part.

According to the substrate pickup tool, the substrate assembly station and the substrate installation method as discussed in the above embodiment, the outer contact surfaces of the flexible gripper press against the through hole of the substrate, such that the substrate pickup tool can pick up a substrate having a flat surface due to without electronic components or pick up a substrate having an uneven surface due to electronic components thereon for stacking such substrate onto the assembling part.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
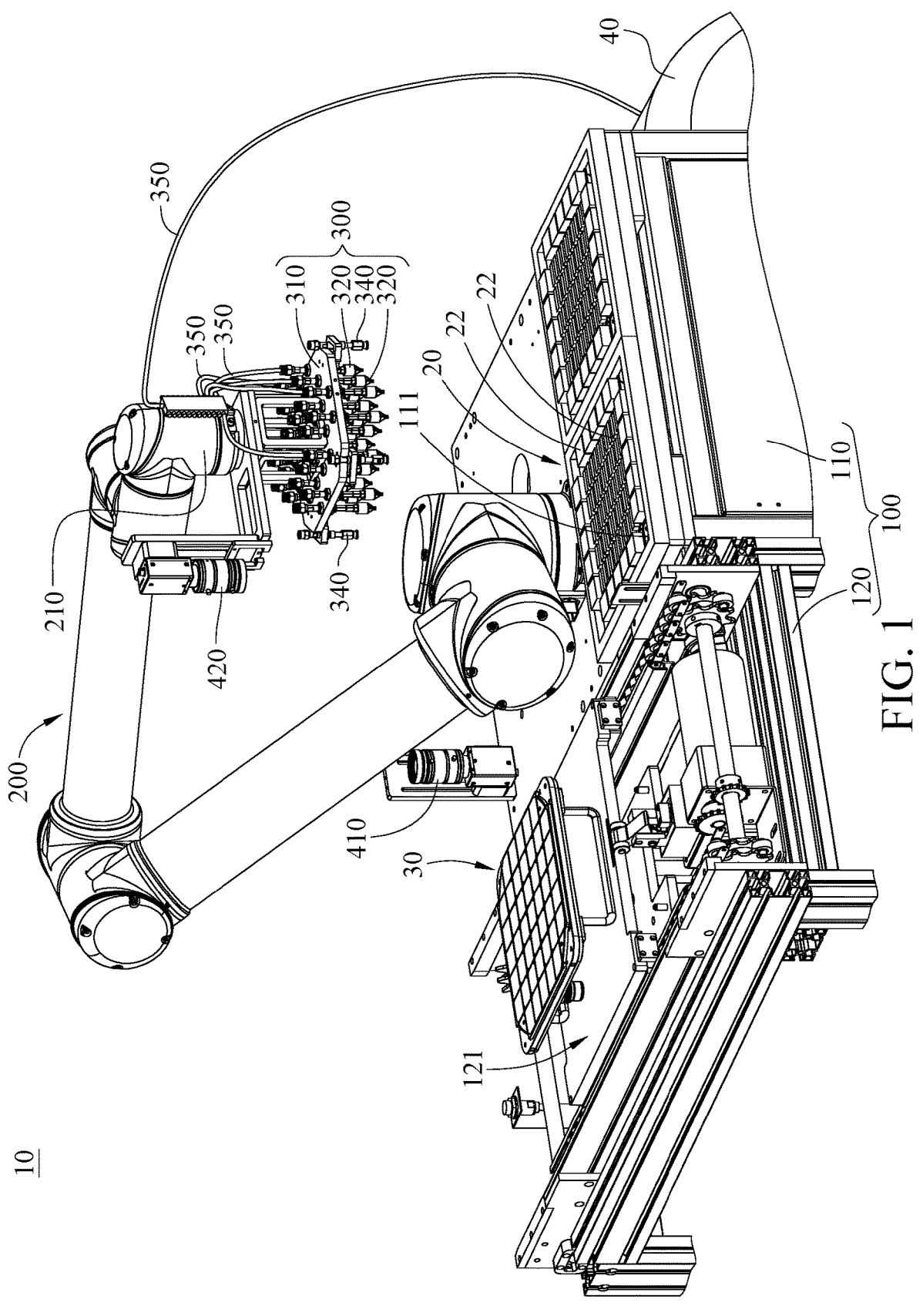
FIG. 1 is a perspective view of a substrate assembly station according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
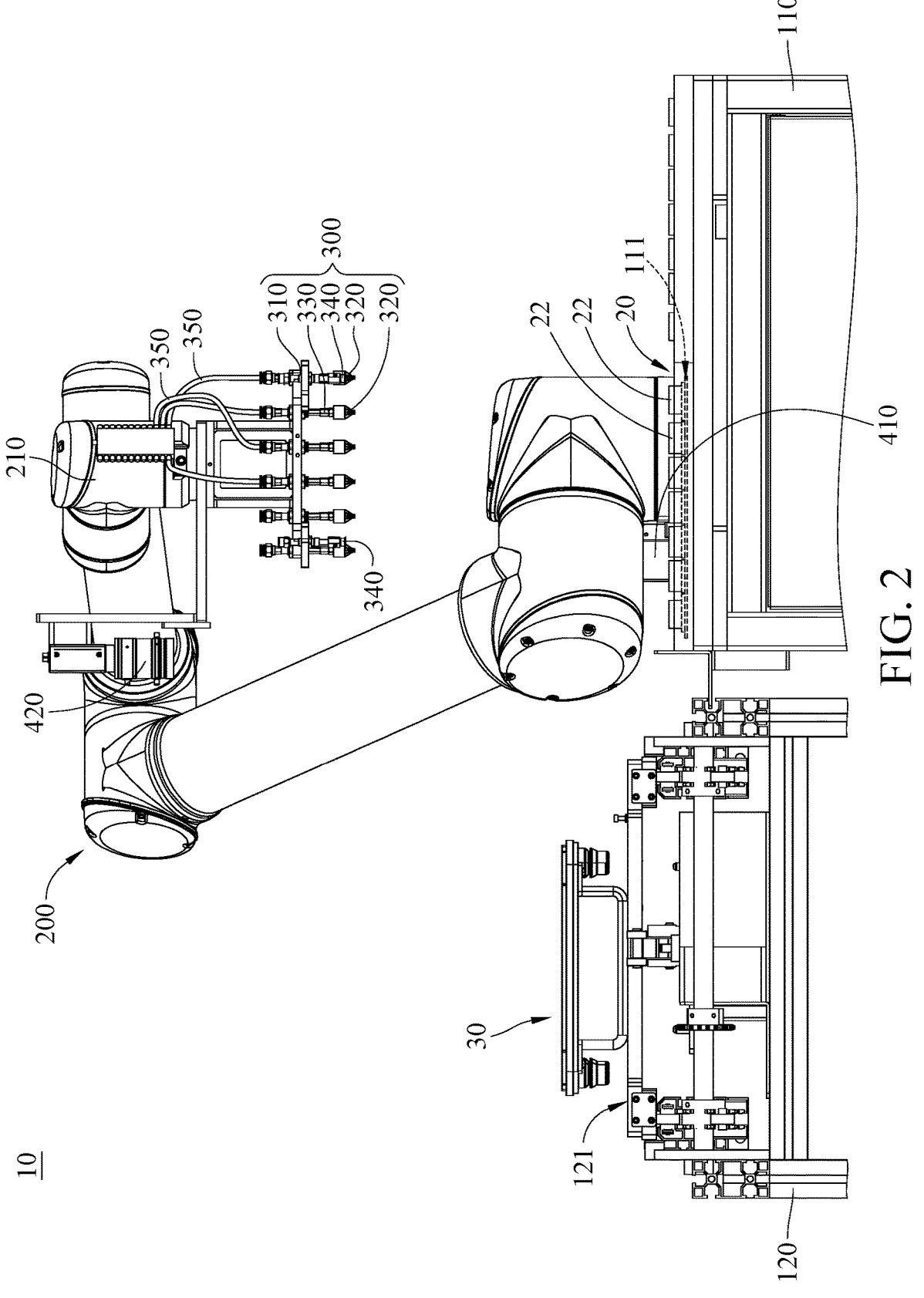
FIG. 2 is a side view of the substrate assembly station in FIG. 1.
Figure 3:
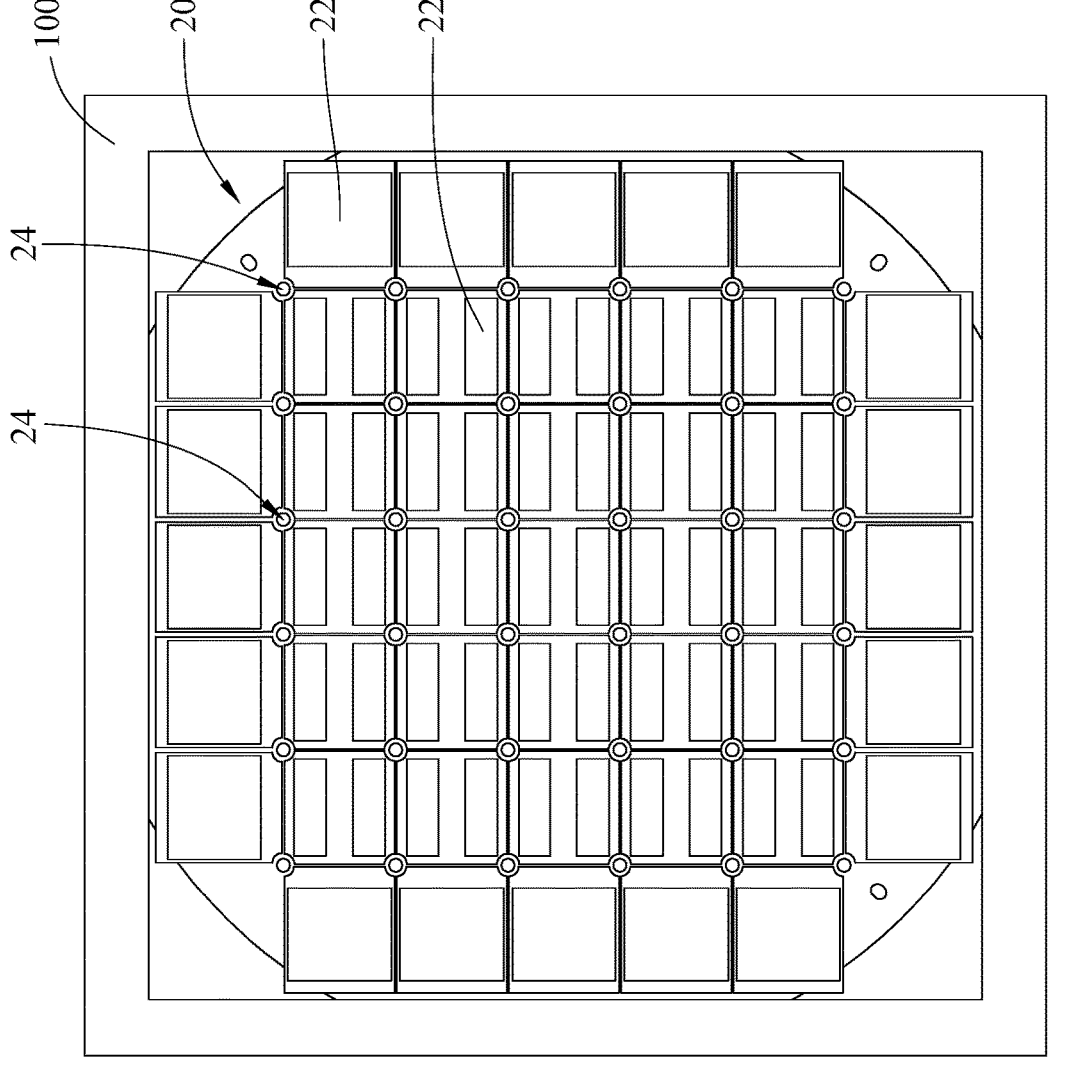
FIG. 3 is a top view of a substrate and a part of a support device in FIG. 1.

Referring to FIGS. 1 to 3, FIG. 1 is a perspective view of a substrate assembly station 10 according to one embodiment of the disclosure, FIG. 2 is a side view of the substrate assembly station 10 in FIG. 1, and FIG. 3 is a top view of a substrate 20 and a part of a support device 100 in FIG. 1.

In this embodiment, the substrate assembly station 10 is used to install a substrate 20 onto an assembling part 30. The substrate 20 is, for example but not limited to, a wafer (e.g., system on wafer) having a plurality of electronic components 22, and the substrate 20 is, for example, provided with a plurality of through holes 24. The assembling part 30 is, for example but not limited to, a cold plate.

The substrate assembly station 10 includes a support device 100, a transfer mechanism 200 and a substrate pickup tool 300. The support device 100 includes a support frame 110 and a conveyor 120. The support frame 110 has a support surface 111, and the support surface 111 is used to support the substrate 20. The conveyor 120 has a carrier 121, and the carrier 121 is used to support the assembling part 30.

In this embodiment, the support device 100 includes the support frame 110 and the conveyor 120, but the disclosure is not limited thereto; in some other embodiments, the support device may include only one support frame, and this support frame may simultaneously include a support surface and a carrier. Alternatively, the support device may include two support frames, and these two support frames may include a support surface and a carrier, respectively; or the support device may include two conveyors, and these two conveyors may include a support surface and a carrier, respectively.

The transfer mechanism 200 is, for example, a robotic arm with multiple degrees of freedom, such as two or three degrees of freedom. The transfer mechanism 200 is disposed on the support device 100 and has a movable portion 210 movable relative to the support device 100.

Figure 4:
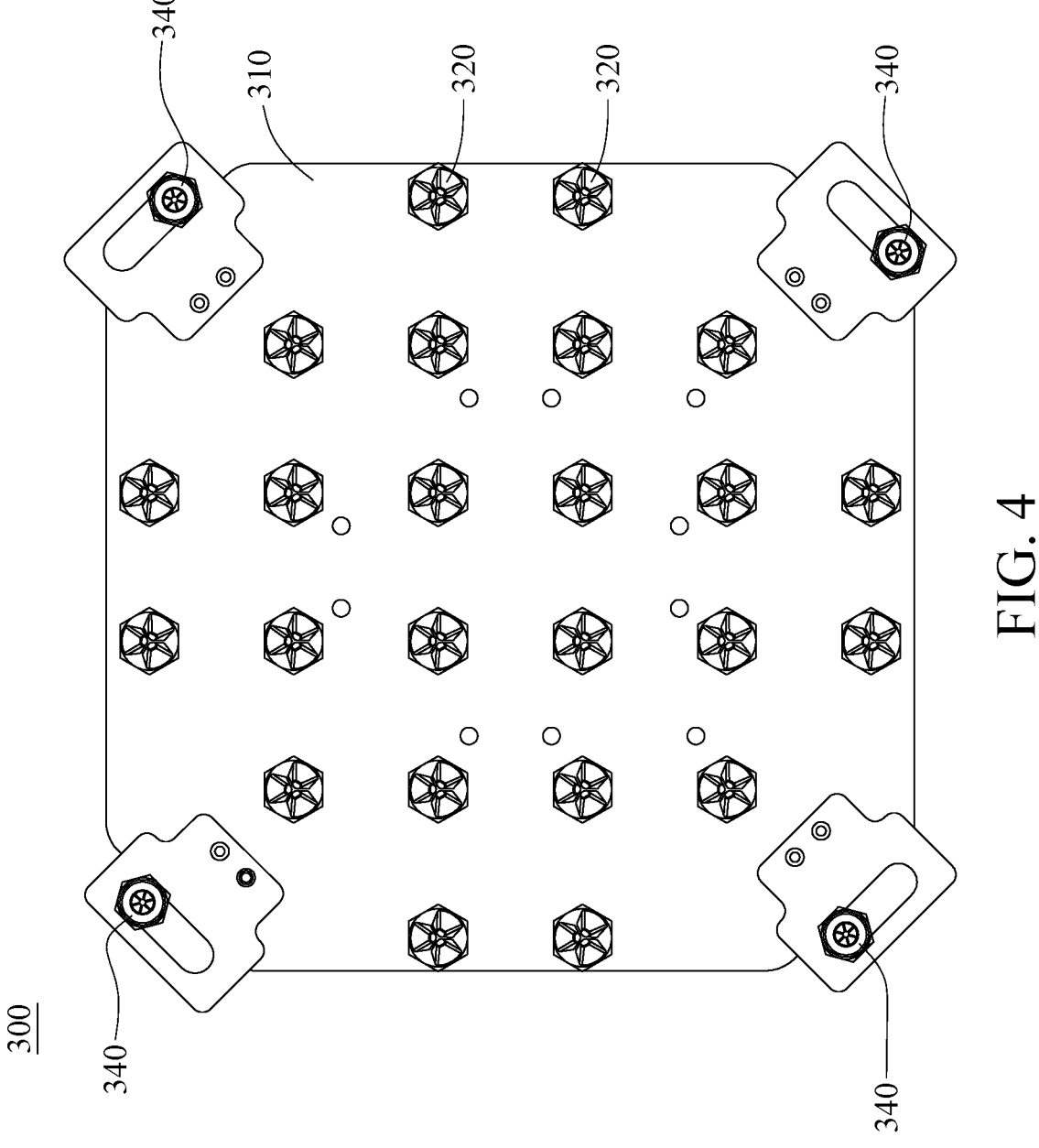
FIG. 4 is a bottom view of a substrate pickup tool in FIG. 1.
Figure 5A:
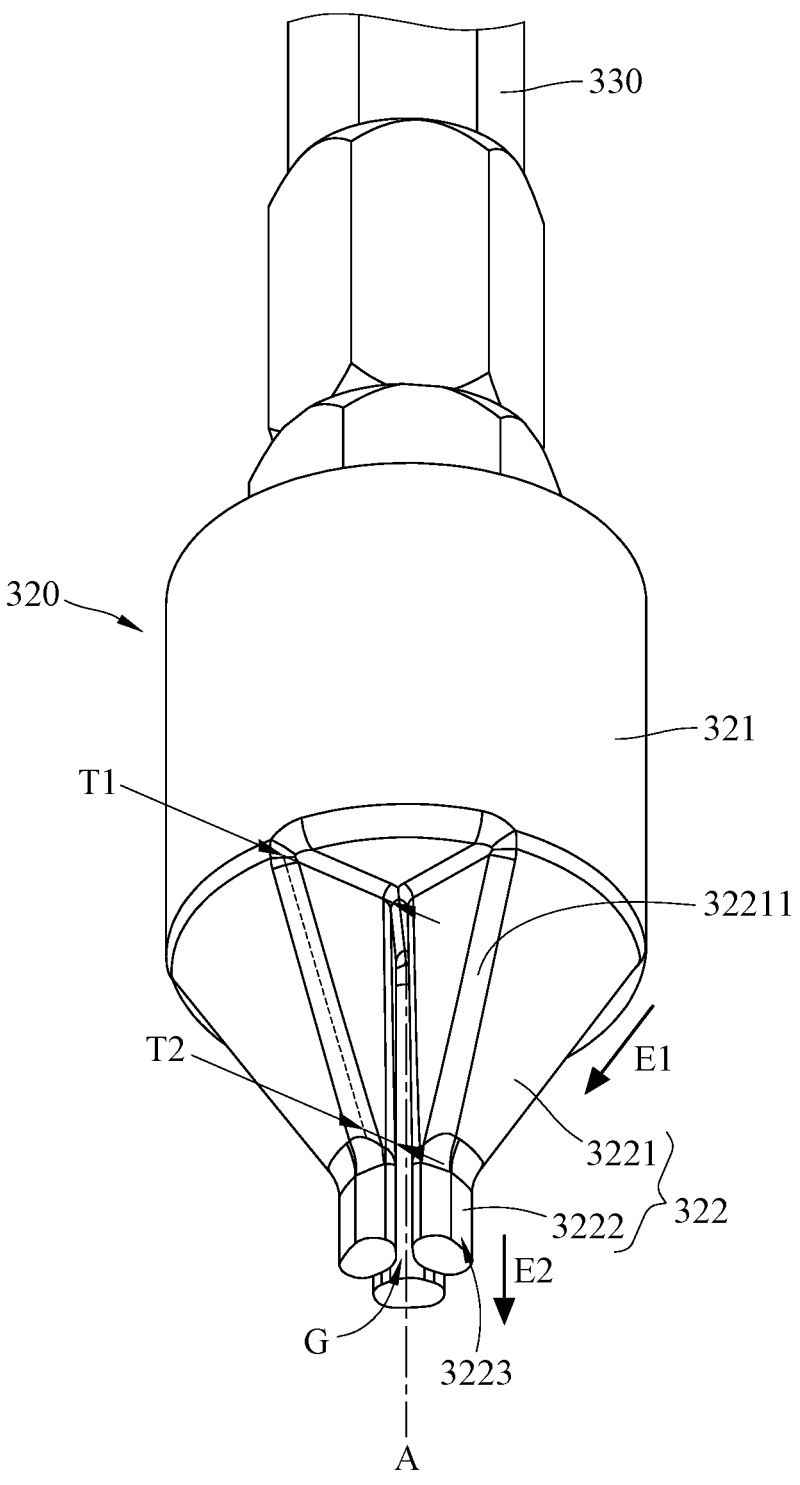
FIG. 5A is a partial perspective view of the substrate pickup tool in FIG. 1.
Figure 5B:
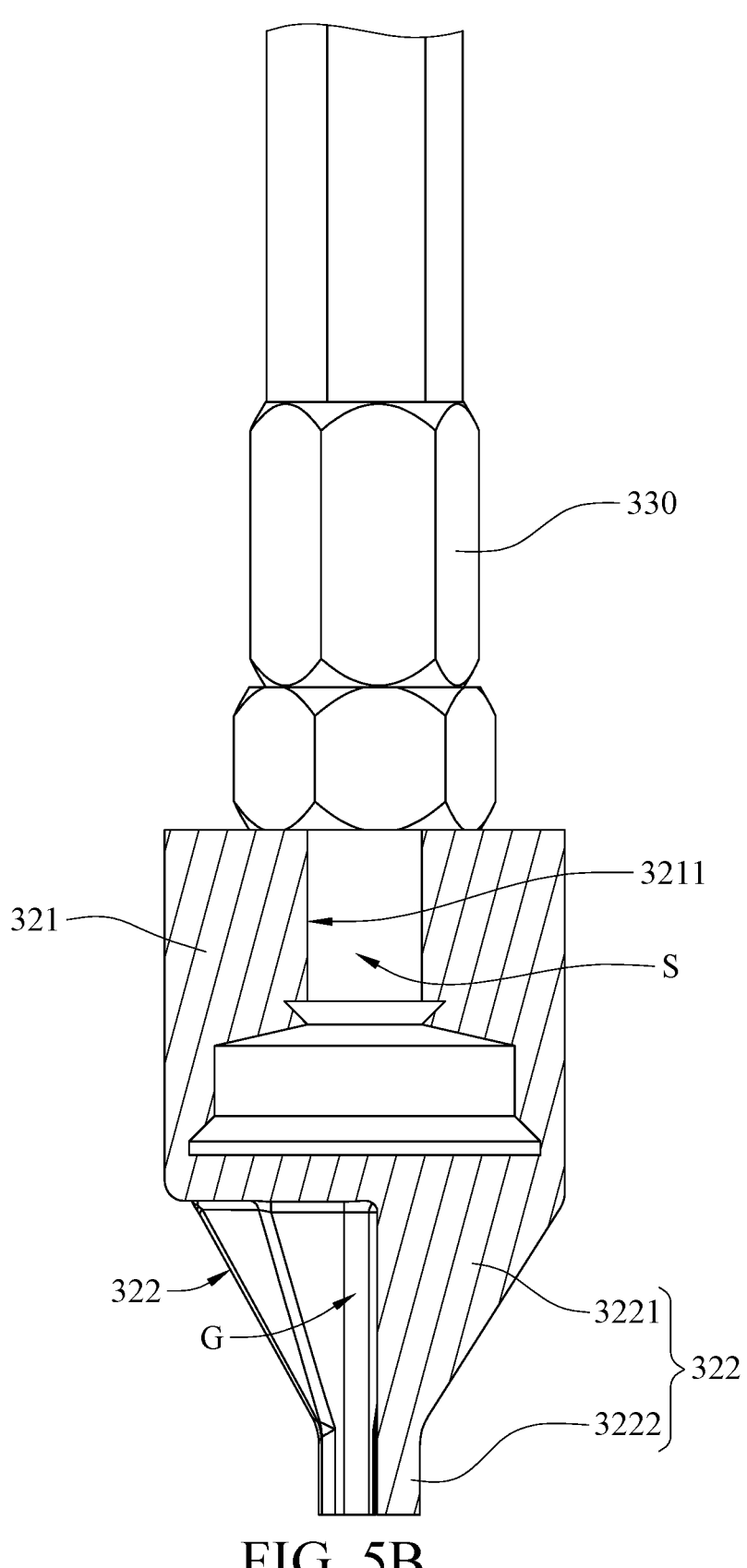
FIG. 5B is a partial cross-sectional view of the substrate pickup tool in FIG. 5A.

Referring to FIGS. 1, 4, 5A and 5B. FIG. 4 is a bottom view of the substrate pickup tool 300 in FIG. 1, FIG. 5A is a partial perspective view of the substrate pickup tool 300 in FIG. 1, and FIG. 5B is a partial cross-sectional view of the substrate pickup tool 300 in FIG. 5A. The substrate pickup tool 300 includes a gripper frame 310 and a plurality of flexible grippers 320. The gripper frame 310 is disposed on the movable portion 210 of the transfer mechanism 200. The flexible grippers 320 are disposed on the gripper frame 310, and the flexible grippers 320 are the same in structure, and thus the following descriptions merely introduce one of them in detail. The flexible gripper 320 is, for example, made of rubber material and includes an annular mount portion 321 and a plurality of claw portions 322. The annular mount portion 321 is mounted on the gripper frame 310 via, for example, a pipe joint 330. The annular mount portion 321 has a chamber S (shown in FIG. 5B), the chamber S is surrounded and formed by an inner wall surface 3211 of the annular mount portion 321, the chamber S communicates with the pipe joint 330, and the pipe joint 330 is connected to a gas supply 40 (shown in FIG. 1) via a connection pipe 350. The gas supply 40 is, for example but not limited to, a gas compressor. In order to clearly show the structure of the substrate pickup tool 300, only some of the pipe joints 330 are connected to the connection pipes 350. However, in practical, each of the pipe joints 330 is connected to one connection pipe 350.

Each of the claw portions 322 extends from the annular mount portion 321 toward a direction away from the gripper frame 310, and each of the claw portions 322 has an outer contact surface 3223. Specifically, the claw portions 322 of the flexible gripper 320 surround a gap G, and the outer contact surfaces 3223 of the claw portions 322 face away from the gap G. Gas F (shown in FIG. 8) is used to flow into the chamber S through the pipe joint 330 and push the inner wall surface 3211 surrounding the chamber S for forcing the claw portions 322 of the flexible gripper 320 to move away from one another.

When the gas F flows into the chamber S, the gas F pushes the inner wall surface 3211 surrounding the chamber S so as to deform the chamber S to drive the claw portions 322 of the flexible gripper 320 to move away from one another and force the outer contact surfaces 3223 of the claw portions 322 to press against an inner wall surface of through hole 24 for picking up the substrate 20, and then the transfer mechanism 200 drives the flexible gripper 320 through the gripper frame 310 to move and install the substrate 20 onto the assembling part 30. For example, the outer contact surfaces 3223 of the claw portions 322 press against the inner wall surface of through hole 24, which represents that the friction between the claw portions 322 and the substrate 20 enables the flexible gripper 320 to hold the substrate 20 for preventing the substrate 20 from being moved relative to the claw portions 322.

In this embodiment, the claw portions 322 are, for example, the same in structure, and thus the following descriptions merely introduce one of them in detail. The claw portion 322 includes an inclined part 3221 and a straight part 3222. The inclined part 3221 is connected to the annular mount portion 321, and an extension direction E1 of the inclined part 3221 is, for example, at an angle to a central axis A of the annular mount portion 321. For example, the extension direction E1 of the inclined part 3221 is non-parallel to the central axis A of the annular mount portion 321. The straight part 3222 is connected to the inclined part 3221, and an extension direction E2 of the straight part 3222 is parallel to the central axis A of the annular mount portion 321; that is, the straight part 3222 is connected to the annular mount portion 321 via the inclined part 3221, and the extension direction E2 of the straight part 3222 is at an angle to the extension direction E1 of the inclined part 3221. For example, the extension direction E2 of the straight part 3222 is non-parallel to the extension direction E1 of the inclined part 3221. In addition, the outer contact surface 3223 is, for example, located at one side of the inclined part 3221 and one side of the straight part 3222 which are located farther away from the gap G for enabling the straight part 3222 to press against the substrate 20 independently, enabling the inclined part 3221 to press against the substrate 20 independently, or enabling the straight part 3222 and the inclined part 3221 to press against the substrate 20 together.

In this embodiment, each of the inclined parts 3221 includes two evasive inclined surfaces 32211, and the evasive inclined surfaces 32211 are used for avoiding the flexible gripper 320 from interfering with the electronic components 22 of the substrate 20.

In this embodiment, the inclined parts 3221 are the same in structure, and thus the follow descriptions merely introduce one of them in detail. A thickness of the inclined part 3221 gradually decreases from one side of the inclined part 3221 located farther away from the straight part 3222 to another side of the inclined part 3221 located closer to the straight part 3222; that is, a thickness T1 of one side of the inclined part 3221 located farther away from the straight part 3222 is greater than a thickness T2 of another side of the inclined part 3221 located closer to the straight part 3222. As a result, when the gas F (shown in FIG. 8) flows into the chamber S, the gas F pushes the inner wall surface 3211 forming the chamber S so as to deform the chamber S for moving the inclined part 3221 and the straight part 3222 outwardly. In other words, the inclined part 3221 and the straight part 3222 is moved along a direction away from the gap G; that is, the gap G formed by the inclined parts 3221 and the straight parts 3222 of the claw portions 322 is enlarged.

In this embodiment, it is illustrated that the substrate 20 is assumed to be in non-bent state; that is, each of the flexible grippers 320 holds the substrate 20 by merely using the straight parts 3222 of the claw portions 322, but the disclosure is not limited thereto; in some other embodiments, the flexible gripper may hold the substrate which is in bent state. When the substrate is deformed to be in a curved state, the flexible gripper may hold an outer periphery of the substrate by using the inclined parts of the claw portions and hold a central portion of the substrate by using the straight parts of the claw portions.

In this embodiment, the annular mount portion 321 is, for example, mounted on the gripper frame 310 via the pipe joint 330, but the disclosure is not limited thereto; in some other embodiments, the annular mount portion may be directly mounted on the gripper frame.

In this embodiment, the substrate assembly station 10 may further include a first image capturing device 410 and a second image capturing device 420. The first image capturing device 410 and the second image capturing device 420 both are, for example, cameras. The first image capturing device 410 is disposed on the support frame 110 of the support device 100. The second image capturing device 420 is disposed on the movable portion 210 of the transfer mechanism 200, and is movable along with the movable portion 210 of the transfer mechanism 200.

In this embodiment, the substrate 20 still has some flat areas, and thus the substrate pickup tool 300 may be provided with a plurality of suction nozzles 340 for attaching to the flat areas of the substrate 20 via a vacuum or suction effect. Therefore, the substrate pickup tool 300 can pick up the substrate 20 more firmly and stably. However, the quantity of the suction nozzles 340 are not restricted in the disclosure and may be modified to be one or another number, or the suction nozzles may be omitted in some other embodiments.

Figure 6:
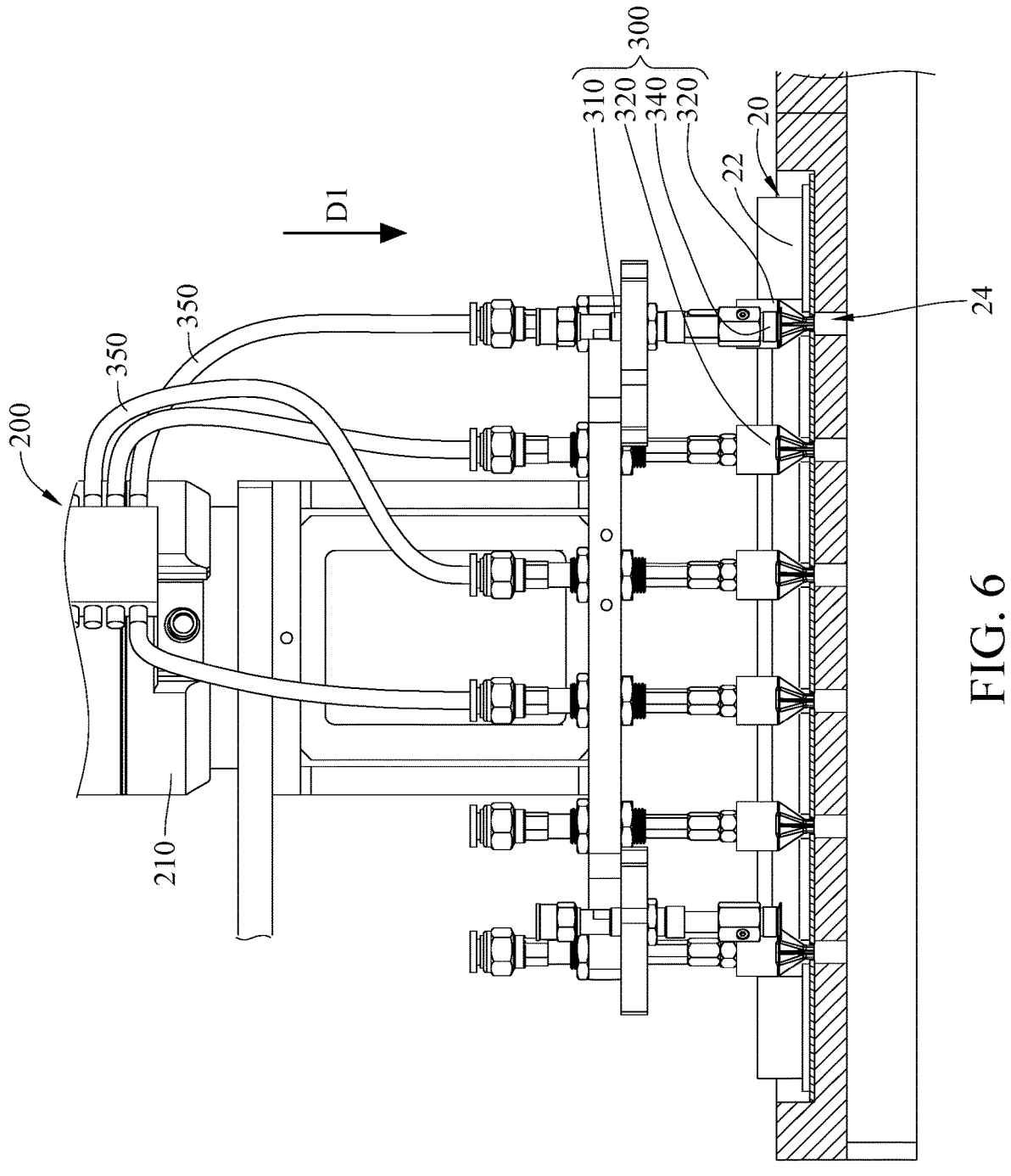
FIGS. 6 to 11 are schematic views showing an installation of the substrate performed by the substrate assembly station in FIG. 1.
Figure 7:
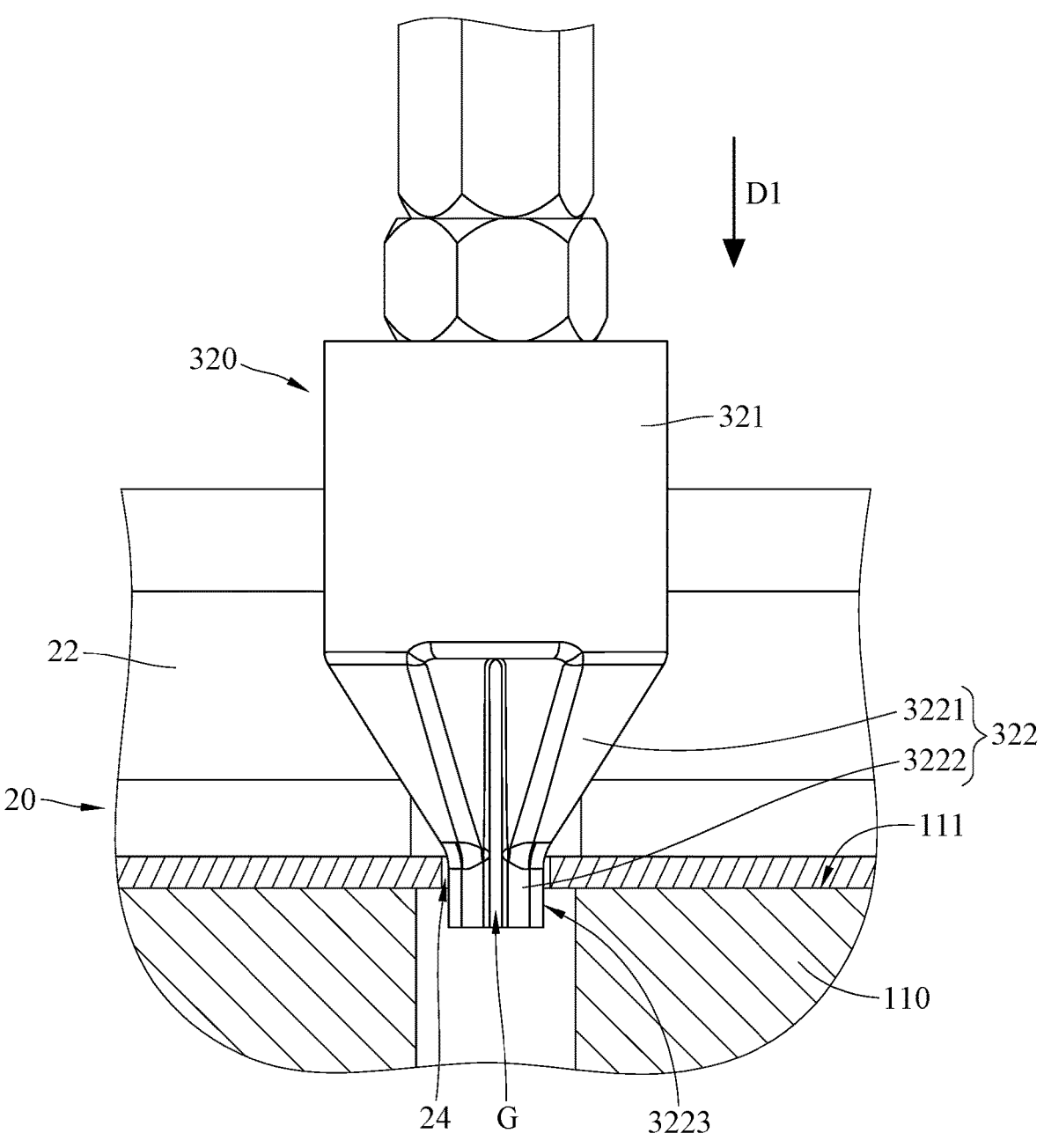
Figure 8:
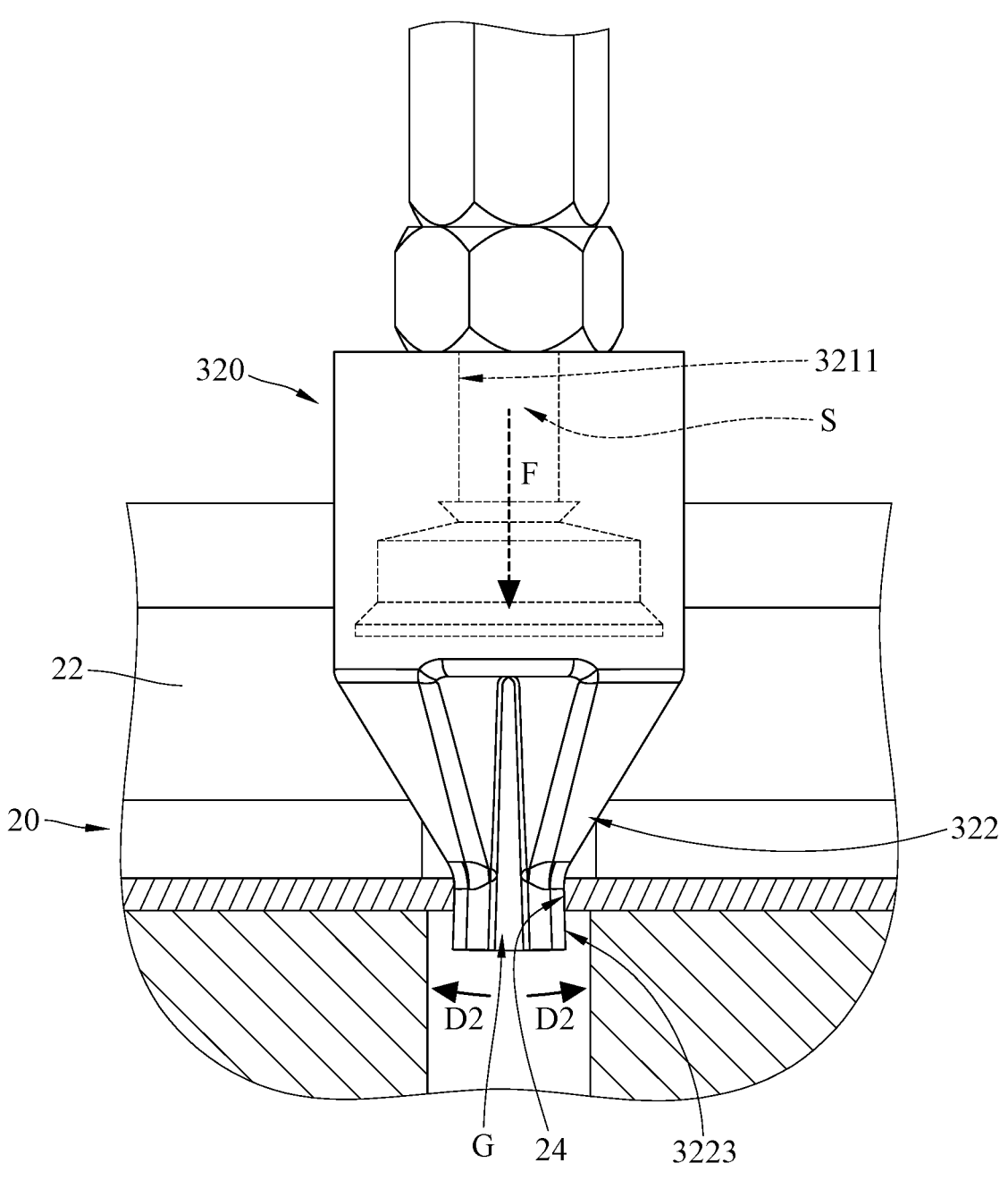

Referring to FIGS. 6 to 11, FIGS. 6 to 11 are schematic views showing an installation of the substrate 20 performed by the substrate assembly station 10 in FIG. 1. In order to clearly show the structure of the substrate pickup tool 300, only some of the pipe joints 330 are connected to the connection pipes 350. However, in practical, each of the pipe joints 330 is connected to one connection pipe 350. As shown in FIGS. 6 and 7, the flexible grippers 320 of the substrate pickup tool 300 are inserted into the through holes 24 of the substrate 20 along a direction D1. Then, as shown in FIG. 8, the gas supply 40 (shown in FIG. 1) drives the gas F to flow into the chambers S of the flexible grippers 320, such that the gas F pushes the inner wall surfaces 3211 forming the chambers S so as to deform the chambers S and force the claw portions 322 of the flexible grippers 320 to expand toward the inner wall surfaces of the through holes 24 along a direction D2. As a result, the outer contact surfaces 3223 of the claw portions 322 press against the inner wall surfaces of the through holes 24 so as to hold the substrate 20; that is, the flexible grippers 320 of the substrate pickup tool 300 holds the substrate 20.

Figure 9:
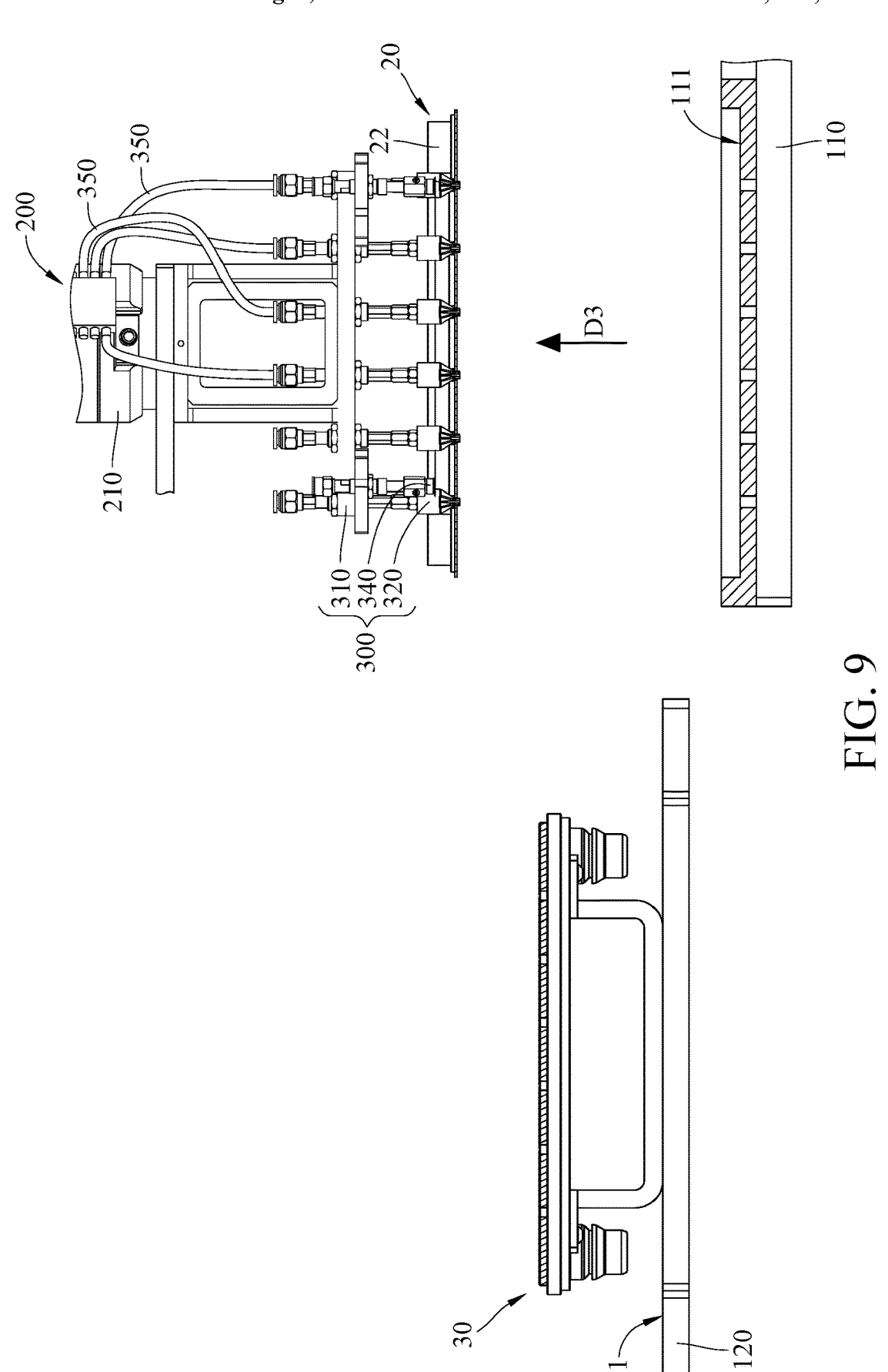

Then, as shown in FIG. 9, the transfer mechanism 200 lifts up the substrate pickup tool 300 along a direction D3 to separate the substrate 20 from the support surface 111 of the support frame 110 along the direction D3. In addition, when the substrate 20 is separated from the support surface 111 of the support frame 110, the substrate 20 can be moved above the first image capturing device 410, such that the first image capturing device 410 (shown in FIG. 2) can capture the substrate 20 to obtain a first image.

Figure 10:
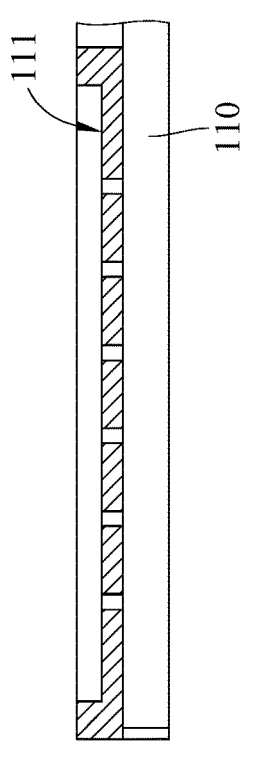
Figure 10:
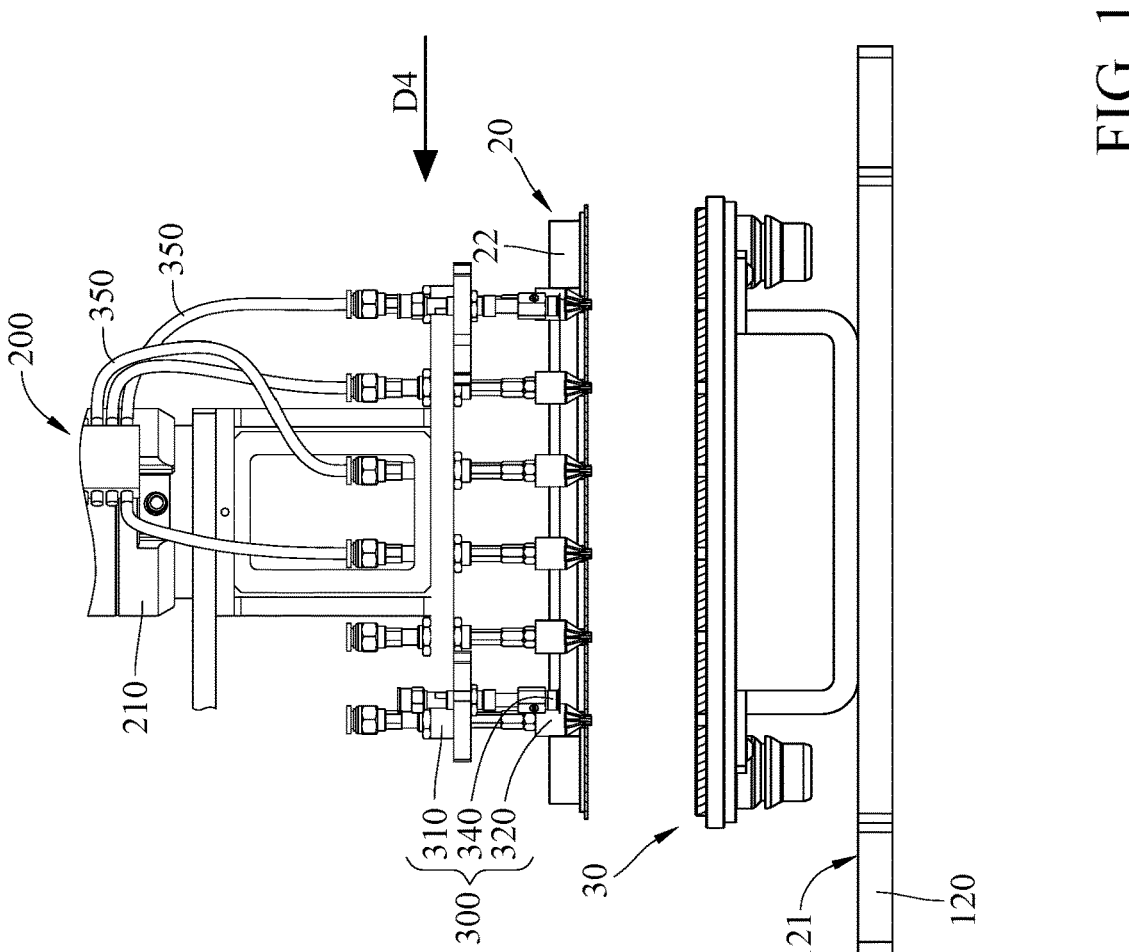

Then, as shown in FIG. 10, the transfer mechanism 200 moves the substrate pickup tool 300 along a direction D4 so as to move the substrate 20 to be located above the assembling part 30 along the direction D4. In addition, when the substrate 20 is located above the assembling part 30, the second image capturing device 420 (shown in FIG. 2) can capture the assembling part 30 to obtain a second image. Then, the substrate 20 can be aligned with the assembling part 30 according to the first image and the second image.

Figure 11:
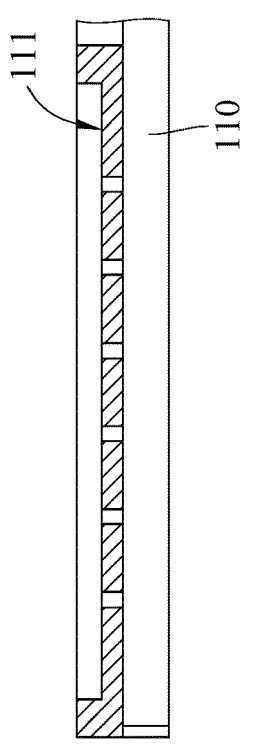
Figure 11:
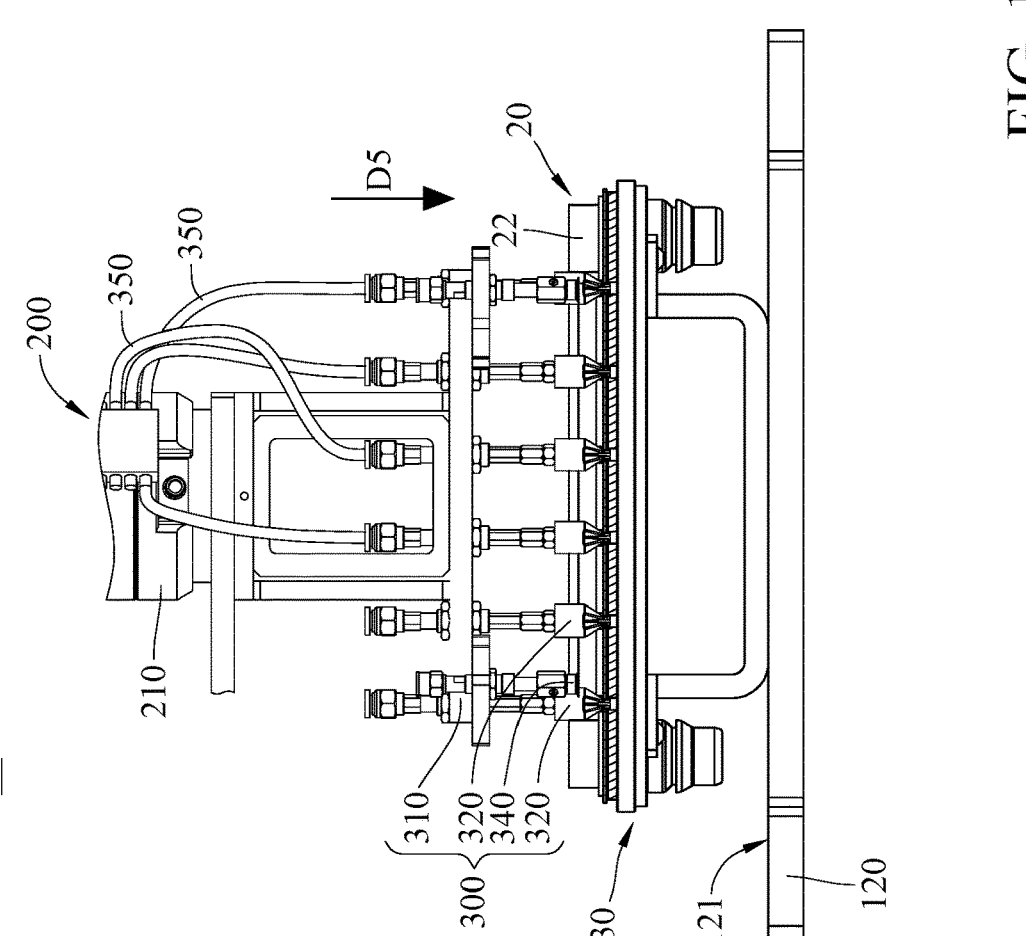

Then, as shown in FIG. 11, the substrate pickup tool 300 is moved along a direction D5 so as to move the substrate 20 to be located closer to the carrier 121 and stack the substrate 20 onto the assembling part 30.

Moreover, before the substrate pickup tool 300 is moved to stack the substrate 20 onto the assembling part 30, the conveyor 120 may convey the assembling part 30 for the substrate 20 to be stacked onto the substrate 20.

Furthermore, the substrate 20 is illustrated as a wafer in larger size and with the through holes 24, and the substrate pickup tool 300 correspondingly includes the multiple flexible grippers 320, but the disclosure is not limited thereto; in some other embodiments, the substrate may be a wafer in smaller size and with only one through hole, and the substrate pickup tool may include only one flexible gripper.

According to the substrate pickup tool, the substrate assembly station and the substrate installation method as discussed in the above embodiment, the outer contact surfaces of at least one flexible gripper press against the through hole of the substrate, such that the substrate pickup tool can pick up a substrate having a flat surface without electronic components or pick up a substrate having an uneven surface with electronic components thereon for stacking such substrate onto the assembling part.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A substrate pickup tool, used to pick up a substrate provided with a through hole, the substrate pickup tool comprising:

a gripper frame; and a flexible gripper, comprising an annular mount portion and a plurality of claw portions, wherein the annular mount portion is mounted on the gripper frame, the plurality of claw portions are connected to the annular mount portion and each has an outer contact surface, the flexible gripper is used to correspond to the through hole of the substrate;

wherein the flexible gripper is provided with a chamber which is surrounded and formed by an inner wall surface of the flexible gripper; a central axis of the flexible gripper passes through the chamber, the annular mount portion, and a pipe joint; and the chamber is configured for gas to pass therethrough to force the plurality of claw portions to move relative to the annular mount portion for pressing against an inner wall surface of the through hole via the outer contact surface of each of the plurality of claw portions, wherein the annular mount portion has an end surface facing away from the chamber in an axial direction, and the plurality of claw portions are entirely located outside the chamber and connected to the end surface of the annular mount portion.

2. The substrate pickup tool according to claim 1, wherein each of the plurality of claw portions comprises an inclined part and a straight part, the inclined part is connected to the annular mount portion, the straight part is connected to the inclined part, and the straight part is at an angle to the inclined part.

3. The substrate pickup tool according to claim 2, wherein the inclined part is provided with at least one evasive inclined surface.

4. The substrate pickup tool according to claim 2, wherein a thickness of the inclined part gradually decreases from one side of the inclined part located farther away from the straight part toward another side of the inclined part located closer to the straight part.

5. A substrate assembly station, used to install a substrate having a through hole onto an assembling part, the substrate assembly station comprising:

a support device, comprising a support surface and a carrier, wherein the support surface and the carrier are used to support the substrate and the assembling part, respectively;

a transfer mechanism, disposed on the support device and provided with a movable portion movable relative to the support device; and a substrate pickup tool, comprising:

a gripper frame, disposed on the movable portion of the transfer mechanism; and a flexible gripper, comprising an annular mount portion and a plurality of claw portions, wherein the annular mount portion is mounted on the gripper frame, the plurality of claw portions are connected to the annular mount portion and each has an outer contact surface, the flexible gripper is used to correspond to the through hole of the substrate;

wherein the flexible gripper is provided with a chamber which is surrounded and formed by an inner wall surface of the flexible gripper; a central axis of the flexible gripper passes through the chamber, the annular mount portion, and a pipe joint; and the chamber is configured for gas to pass therethrough to force the plurality of claw portions to move relative to the annular mount portion and press against an inner wall surface of the through hole via the outer contact surface of each of the plurality of claw portions for picking up the substrate and moving the substrate onto the assembling part via the transfer mechanism, wherein the annular mount portion has an end surface facing away from the chamber in an axial direction, and the plurality of claw portions are entirely located outside the chamber and connected to the end surface of the annular mount portion.

6. The substrate assembly station according to claim 5, wherein each of the plurality of claw portions comprises an inclined part and a straight part, the inclined part is connected to the annular mount portion, the straight part is connected to the inclined part, and the straight part is at an angle to the inclined part.

7. The substrate assembly station according to claim 6, wherein the inclined part is provided with at least one evasive inclined surface.

8. The substrate assembly station according to claim 6, wherein a thickness of the inclined part gradually decreases from one side of the inclined part located farther away from the straight part toward another side of the inclined part located closer to the straight part.

9. The substrate assembly station according to claim 5, wherein the transfer mechanism is a robotic arm.

10. The substrate assembly station according to claim 5, wherein the support device comprises a support frame and a conveyor, the support surface is located at the support frame, and the carrier is located at the conveyor.

11. The substrate assembly station according to claim 5, further comprising a first image capturing device, wherein the first image capturing device is disposed on the support device.

12. The substrate assembly station according to claim 11, further comprising a second image capturing device, wherein the second image capturing device is disposed on the movable portion of the transfer mechanism.

13. A substrate installation method, comprising:

holding a substrate via at least one outer contact surface of a flexible gripper of a substrate pickup tool;

lifting up the substrate pickup tool; and moving the substrate pickup tool to stack the substrate onto an assembling part;

wherein the step of holding the substrate via the at least one outer contact surface of the flexible gripper of the substrate pickup tool comprises:

inserting the flexible gripper of the substrate pickup tool into a through hole of the substrate; and allowing gas to pass through a chamber of the flexible gripper to expand a plurality of claw portions of the flexible gripper toward an inner wall surface of the through hole to press against the inner wall surface of the through hole via outer contact surfaces of the plurality of claw portions for holding the substrate, wherein a central axis of the flexible gripper passes through the chamber of the flexible gripper, an annular mount portion of the flexible gripper, and a pipe joint, wherein the annular mount portion has an end surface facing away from the chamber in an axial direction, and the plurality of claw portions are entirely located outside the chamber and connected to the end surface of the annular mount portion.

14. The substrate installation method according to claim 13, wherein the step of lifting up the substrate pickup tool comprises lifting up the substrate pickup tool via a transfer mechanism.

15. The substrate installation method according to claim 13, before the step of moving the substrate pickup tool to stack the substrate onto the assembling part, further comprising:

conveying the assembling part via a conveyor.

16. The substrate installation method according to claim 13, before the step of moving the substrate pickup tool to stack the substrate onto the assembling part, further comprising:

capturing the substrate via a first image capturing device located on a support device.

17. The substrate installation method according to claim 16, before the step of moving the substrate pickup tool to stack the substrate onto the assembling part, further comprising:

capturing the assembling part via a second image capturing device located on a transfer mechanism for aligning the substrate with the assembling part.

\* \* \* \* \*